United States Patent
Hofmann

(10) Patent No.: US 7,458,416 B2
(45) Date of Patent: Dec. 2, 2008

(54) HEAT-EXCHANGING DEVICE

(75) Inventor: Wilfried Hofmann, Munich (DE)

(73) Assignee: NFT Nanofiltertechnik GmbH, Bad Homburg V.D.H. (DE)

( * ) Notice: Subject to any disclaimer, the term of this patent is extended or adjusted under 35 U.S.C. 154(b) by 628 days.

(21) Appl. No.: 10/522,206

(22) PCT Filed: Jul. 24, 2003

(86) PCT No.: PCT/EP03/08182

§ 371 (c)(1),
(2), (4) Date: Jan. 19, 2005

(87) PCT Pub. No.: WO2004/011867

PCT Pub. Date: Feb. 5, 2004

(65) Prior Publication Data

US 2005/0252644 A1    Nov. 17, 2005

(30) Foreign Application Priority Data

Jul. 24, 2002   (DE) ................ 102 33 736

(51) Int. Cl.
*H05K 7/20*   (2006.01)
(52) U.S. Cl. ............... 165/121; 165/908; 361/695; 361/697
(58) Field of Classification Search ........... 165/908, 165/121; 361/697, 695
See application file for complete search history.

(56) References Cited

U.S. PATENT DOCUMENTS

| | | | |
|---|---|---|---|
| 4,851,965 A * | 7/1989 | Gabuzda et al. ............. | 165/908 |
| 4,859,805 A | 8/1989 | Kawakami et al. | |
| 5,077,601 A * | 12/1991 | Hatada et al. ................ | 361/697 |
| 5,195,576 A * | 3/1993 | Hatada et al. ............... | 165/80.3 |
| 5,428,503 A * | 6/1995 | Matsushima et al. ........ | 165/908 |
| 5,508,883 A * | 4/1996 | Lumbra et al. .............. | 361/697 |
| 5,563,768 A * | 10/1996 | Perdue ........................ | 361/695 |
| 5,576,932 A * | 11/1996 | Bishop et al. ............... | 361/697 |
| 5,763,950 A * | 6/1998 | Fujisaki et al. .............. | 257/712 |
| 5,787,975 A | 8/1998 | Grenier et al. | |
| 6,067,227 A | 5/2000 | Katsui et al. | |
| 6,781,834 B2 * | 8/2004 | Nair et al. .................... | 361/697 |
| 2005/0082035 A1 * | 4/2005 | Debashisu et al. ......... | 165/80.3 |

FOREIGN PATENT DOCUMENTS

| | | |
|---|---|---|
| DE | 38 22 890 A1 | 9/1989 |
| DE | 39 29 004 A1 | 3/1991 |
| DE | 92 14 061 U1 | 10/1992 |
| DE | 196 19 060 A1 | 11/1997 |
| DE | 198 13 119 A1 | 10/1999 |
| DE | 100 41 829 A1 | 3/2002 |
| DE | 102 33 736 B3 | 4/2004 |
| EP | 0 308 576 A2 | 3/1989 |
| JP | 11-186762 A | 7/1999 |

* cited by examiner

*Primary Examiner*—Leonard R Leo
(74) *Attorney, Agent, or Firm*—Senniger Powers LLP

(57) ABSTRACT

A heat exchanger comprising a substrate that comprises a bottom side and a top side; a unit for generating a directed fluid stream with a flow direction that is tangential to the bottom side and to the top side of substrate; webs projecting from the top side of substrate and perpendicular to the flow direction, lying one after the other in the flow direction, wherein a height of the webs is less than a spacing of adjacent webs in the flow direction; and a plurality of regularly arranged channels extending through the substrate.

14 Claims, 10 Drawing Sheets

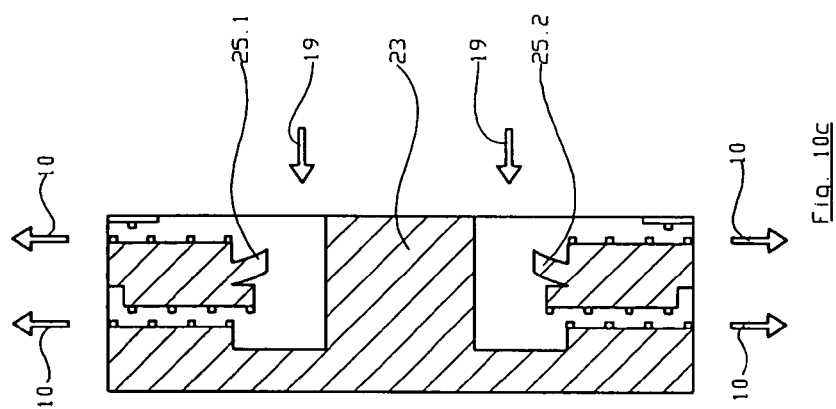
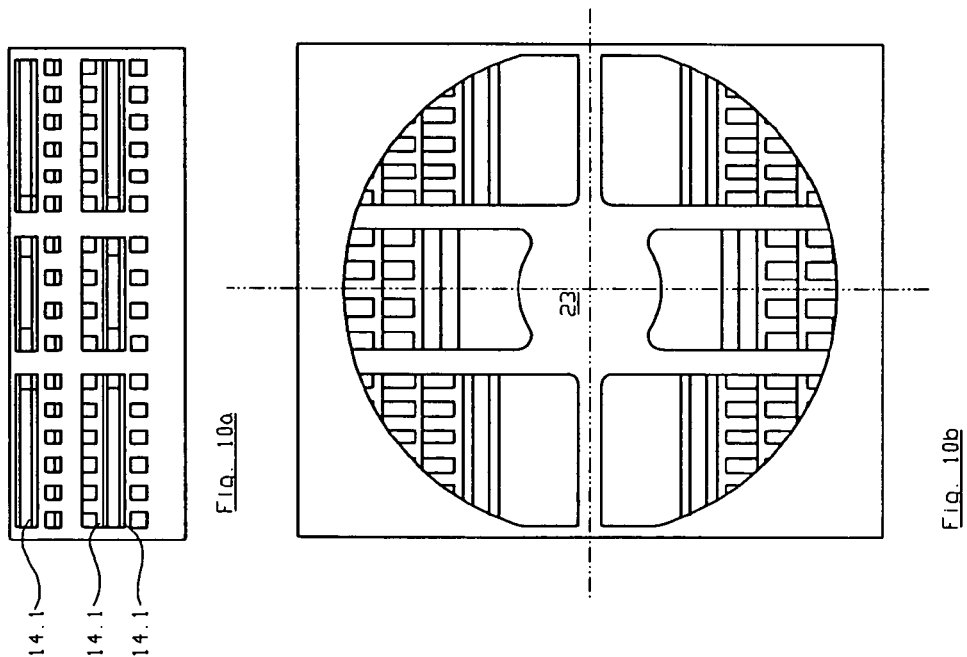
Fig. 10

HEAT-EXCHANGING DEVICE

FIELD OF THE INVENTION

The present invention relates to a heat exchanging device according to the preamble of claim 1.

BACKGROUND OF THE INVENTION

Such a heat exchanging device is known from DE 39 29 004 A1. This publication shows a heat exchanger with double plates having on inside and outside surfaces profiles that are constructed as beads or webs lying perpendicular to the direction of flow. These webs are arranged one after the other in the flow direction and their height is less than the spacing of adjacent webs. The webs are intended here to bring about turbulence in the flowing medium and thus an improved heat transfer.

DE 38 22 890 A1 shows a cooling arrangement with a blower and a plurality of parallel cooling elements, each comprising elongated cooling webs and gap openings interspersed between them, wherein the cooling webs of every two adjacent cooling elements are offset from one another such that in the direction of flow the cooling webs of one cooling element cover the gap opening of the adjacent cooling element.

DE 198 13 119 A1 shows a turbulence heat recapture device with profiled plates, the profiles of which are inclined alternately one from the other by the same angle from the longitudinal direction of the pressure gradient. The intention thereby is to generate a turbulent flow that improves heat exchanger performance.

Such heat exchanging devices are used, for instance, to cool electronic components such as microprocessors or chips. A distinction is generally made between active and passive cooling units. In active cooling units, subassemblies such as fans or ventilators are used to support the removal of heat with the aid of a fluid stream, or to make it possible at all. The fluid stream thus generated flows through a cooling body that is coupled to a heat source and absorbs heat from it. Known cooling bodies have a rib or column structure and are partially roughened on the surface. The fluid flowing around or through the cooling body thereby absorbs the heat. Air is mainly used as fluid in the cooling of processors. Since air is a very poor conductor of heat, the cooling bodies must be designed to be relatively large in order to have a heat output surface that is large in proportion to the heat intake surface. For this purpose, it is proposed in the prior, not previously published German Patent Application No. 100 41 829 that the heat-output surface be substantially larger than the heat intake surface, which is achieved by a specified structuring in the form of channels and in the form of furrows that are fluidically connected to the channels.

Cooling devices with a substrate through which channels extend are also known from DE 196 19 060 A1 and EP 0 308 576 A2. The channels in those cases can be rectangular or circular.

DE 92 14 061 U1 describes a cooling body whose heat-intake surface comprises ribs and furrows to increase surface area.

One problem for active heat exchanging devices, alongside their large dimensions, is the power requirement for the device for generating the fluid flow. For an effective transfer of heat, a relatively high power consumption and usually a need for space for the corresponding equipment such as a fan result. Another complication is that a good transfer of heat from the heat output surface to the fluid takes place only if the heat output surface has a relatively high flow resistance to the fluid stream. This in turn requires a stronger fan, however.

SUMMARY OF THE INVENTION

The problem of the invention is therefore to create a heat exchanging device that brings high heat exchange performance with a low flow resistance. The heat exchanging device should also have a small space requirement and enable a good transfer of heat even for air as the fluid.

This problem is solved with the characteristics recited in claim 1. Advantageous configurations and refinements of the invention can be deduced from the subordinate claims.

The basic principle of the invention is that webs of low height, lying perpendicular to the direction of flow of the fluid, that project from the surface of the substrate are provided and that channels passing entirely through the substrate are present.

Transfer of heat between the fluid and the substrate takes place only in a very thin boundary layer directly at the surface of the substrate. To increase the transfer of heat, the fluid is directed such that localized turbulences, which increase the transfer of heat between fluid and substrate without substantially increasing the flow resistance, are generated by geometric features of the surface. To generate these turbulences, the regularly arranged webs acting as micro obstacles are provided, as well as regularly arranged channels that extend through the substrate. The substrate is in essence a thin plate that is placed a slight distance above the hot surface of an object that is to be cooled, or a cold one to be heated. Turbulences are formed at the regularly arranged micro obstacles, primarily on the inflow side of the micro obstacles due to collision with the micro obstacles in the area of the channels. Moreover, a kind of inverse chimney effect occurs, i.e., a part of the inflowing fluid moves from above the plate through the channel into the vicinity of or directly onto the hot or cold surface of the object, where an additional coupling of heat to fluid likewise occurs.

The substrate need have only a few channels and webs (micro obstacles) in the direction of flow. Preferably, three channels and webs, arranged in succession in the direction of flow, are sufficient, since studies showed that the heat transfer is maximal in the area of the second and third channels. The fluid absorbs the most heat in this area, which also has the effect that, due to expansion of the fluid, it undergoes an acceleration which supports the removal of heat by the heated fluid.

The substrate can be placed by way of spacers and by means of welding, gluing, soldering, etc. on the hot surface of the object that is to be cooled or the cold one to be heated. The spacers are preferably also webs that extend along the entire substrate in the direction of flow, so that channels for the fluid likewise are created between the object and the bottom of the substrate.

The bond between the substrate and the surface to be cooled or heated is preferably made of thermally conductive material. The substrate can consist of a thermally conductive material such as aluminum, copper or the like. It can also be made, however, of another material such as silicon that is merely coated with a thermally conductive layer. The base material of the substrate thus need not itself be thermally conductive.

The substrate with the webs and, optionally, the channels can be produced by conventional machining processes such as milling or punching from, for example, aluminum plates, or also by etching or surface coating processes, as in the case of silicon.

In a refinement of the invention, guide plates can be provided at the inflow or the outflow end of the substrate to support the flow of fluid into the channel between the substrate and the object surface to be cooled or heated.

According to a refinement of the invention, a thin plate, preferably roughened on the side facing the substrate or likewise having webs corresponding to the webs of the substrate, is arranged above the substrate for the formation of a channel that is also closed towards the top. This plate acting as a top cover improves the flowing off of the fluid, particularly in the last section before the outflow end.

The heat-exchanging devices according to the invention can be combined modularly with one another, with a variety of arrangements of individual modules being possible.

Generally the flow direction in the interior of the heat exchanging device is tangential to the bottom and top sides of the substrate. The flow of fluid to the individual modules can also be perpendicular to the bottom and top sides of the substrate, with means then being provided to deflect the inflowing fluid.

The invention will be explained more extensively below on the basis of one embodiment in conjunction with the drawing.

BRIEF DESCRIPTION OF THE DRAWINGS

FIG. 10a-10c, a front view, a plan view and a cross section of the arrangement of FIG. 9.

DETAILED DESCRIPTION OF THE INVENTION

This application claims priority of German application 102 33 736.5, filed Jul. 24, 2002, the entire disclosure of which is hereby incorporated by reference.

Figure 1:
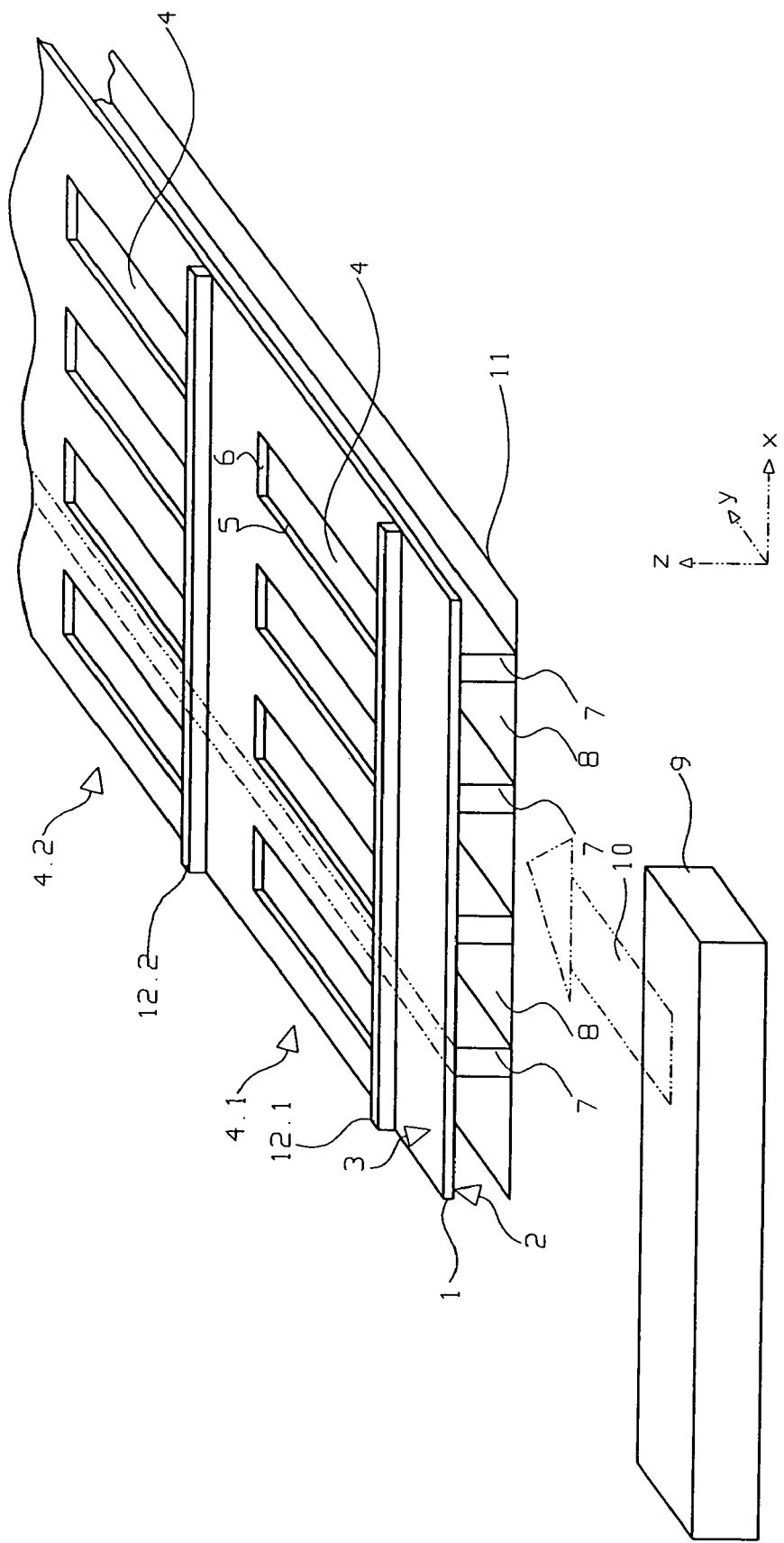
FIG. 1, a perspective partial view of a heat exchanging device according to the invention.

Reference is made first to FIG. 1. A substrate 1 with a bottom side 2 and a topside 3 has a plurality of regularly arranged channels 4 extending through substrate 1; here they are formed in a rectangular shape. The channels have a long edge 5 and a cross edge 6. Substrate 1 is held by spacers 7 opposite the surface of an object 11 with which heat is to be exchanged, the spacers 7 extending over the entire length of the substrate. Several spacers 7 running parallel to one another are provided, each being arranged such that it runs between the channels 4. Thereby, additional channels 8 running along the length of the substrate are created between substrate 1, object 11 and spacers 7. A unit 9 which may, for instance, be a blower generates a directed fluid stream that flows in the direction of arrow 10, referred to below as the inflow direction 10, through channels 8 and thus along both the bottom side 2 and surface 3 of substrate 1 and thus in part also through the channels 4, and in part in both directions, i.e., from up to down and from down to up in another place.

Figure 5:
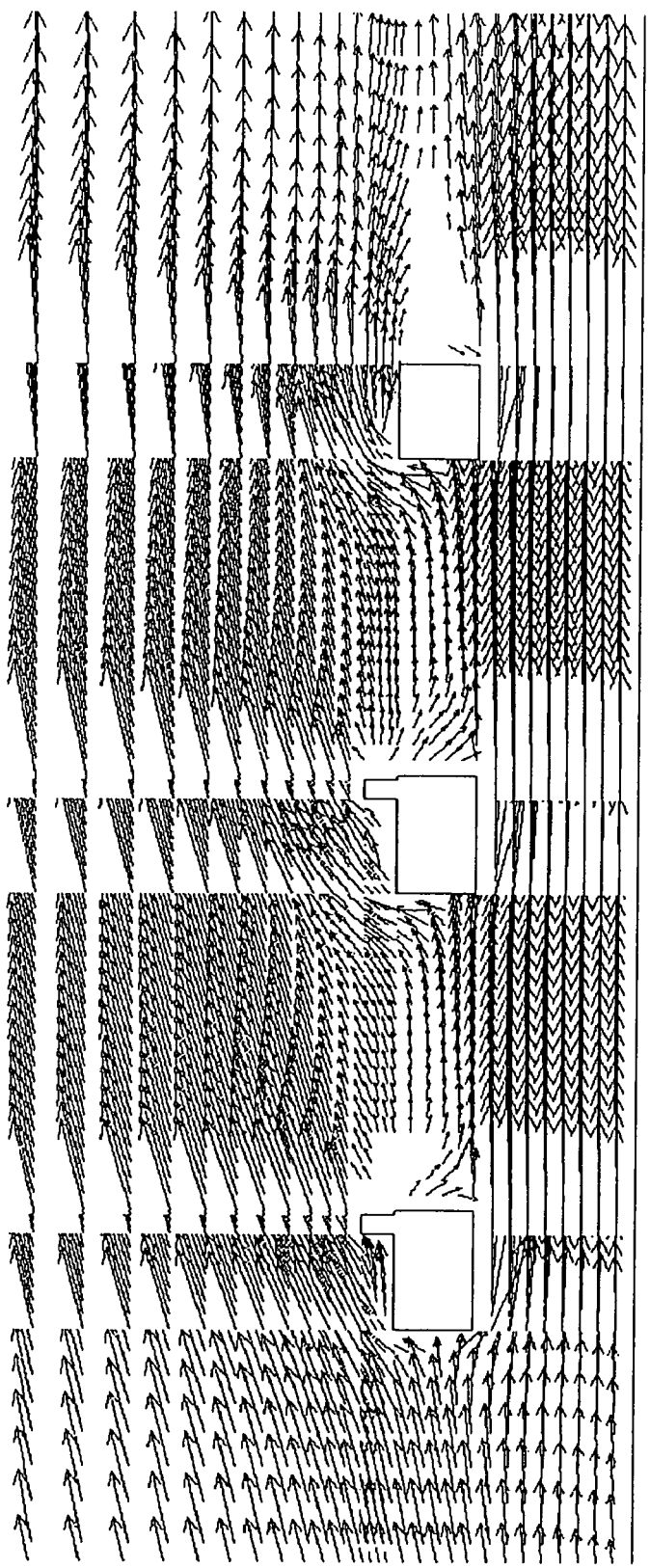
FIG. 5, a diagram of the flow of fluid along the heat exchanging device.

Upstream of the channels 4 in the inflow direction 10, webs 12.1, 12.2 running perpendicular to inflow direction 10 are provided; as is best recognized from FIG. 5, they generate turbulences that provide better heat transfer. On the other hand, webs 12.1, 12.2 are sufficiently low that they raise flow resistance only slightly and are therefore also referred to as "micro obstacles."

Figure 2:
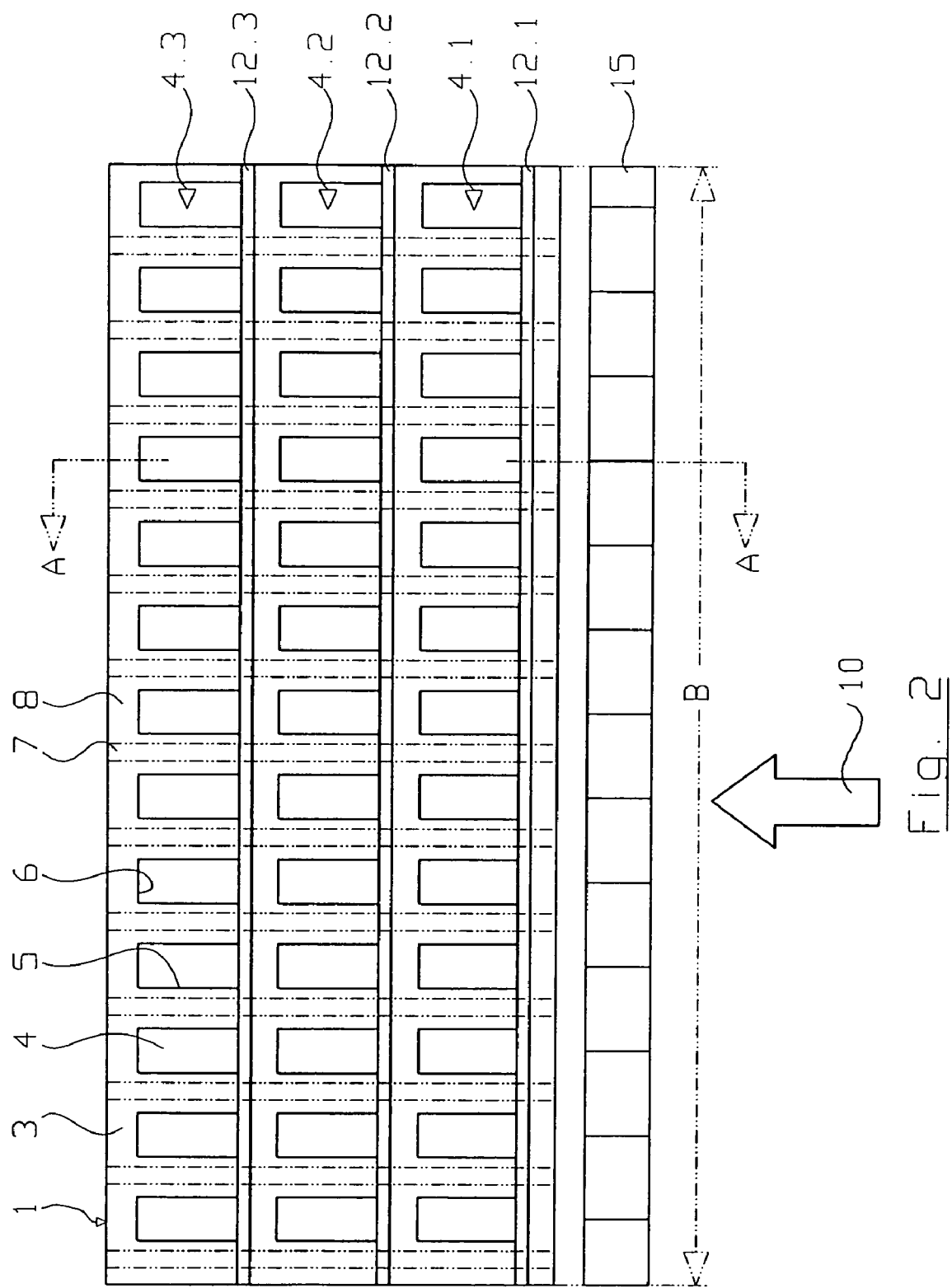
FIG. 2, a plan view of the heat exchanging device.

From the plan view of FIG. 2, it is recognizable that substrate 1 comprises three rows 4.1, 4.2, 4.3 of channels 4 one after the other in flow direction 10 as well as three webs 12.1, 12.2, 12.3 arranged one after the other in the flow direction, each lying in front of the respective row of channels in the flow direction 10. Spacers 7 extending over the entire length of the substrate are arranged in flow direction 10 between the channels 4.

Figure 3:
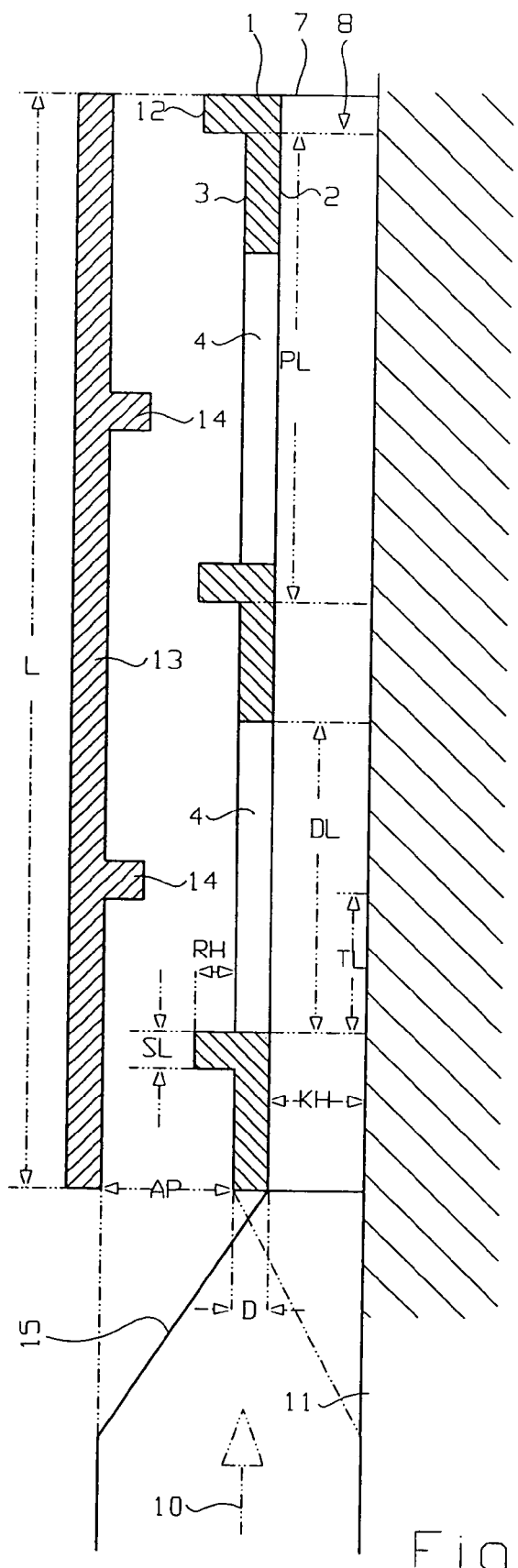
FIG. 3, a cross section of the heat exchanging device along line A A of FIG. 2.

It is recognizable from the sectional view of FIG. 3 that a cover plate 13 kept at a space AP away from top side 3 can be arranged above substrate 1, that is, facing its top side 3. The side of cover plate 13 facing top side 3 of substrate 1 likewise has webs 14 that act to generate turbulence. Instead of webs or in addition thereto, the surface of cover plate 13 that faces substrate 1 can be roughened. The spacing AP is at least twice as large as the height RH of webs 12.

In one concrete example of an embodiment, the substrate has a length L of 16.5 mm in flow direction 10 and a width B of 58 mm perpendicular to flow direction 10 (cf. FIG. 2). Channels 4 have a length DL of 4 mm in the flow direction and perpendicular thereto a width of 2 mm. The length SL of the webs 12 as measured in the flow direction 10 is 0.3 mm; the thickness D of the substrate is 1 mm. Spacing KH, i.e., the height of channels 8 between substrate 1 and object 11 to be cooled, is 2 mm. In this concrete example, the height of webs.

12 is 0.3 mm and is allowed to be at most only half the length DL of channels 4. With this configuration, a cooling power of ca. 20 W was achieved for an incoming flow velocity of ca. 5 m/sec and a temperature of ca. 340 K of the object to be cooled.

With such a heat exchanging device, moreover, an enlargement of surface area by a factor of at least 2 can be achieved for improved heat transfer as compared to a flat surface, since the inside walls of channels 4 and the outside surfaces of webs 12 are also active as surfaces for heat transfer.

From FIGS. 2 and 3 it can also be recognized that a guide plate 15 can be arranged preceding substrate 1 in the flow direction; here it is corrugated and thus ensures a defined distribution of the fluid stream along top and bottom sides of the substrate.

Figure 4:
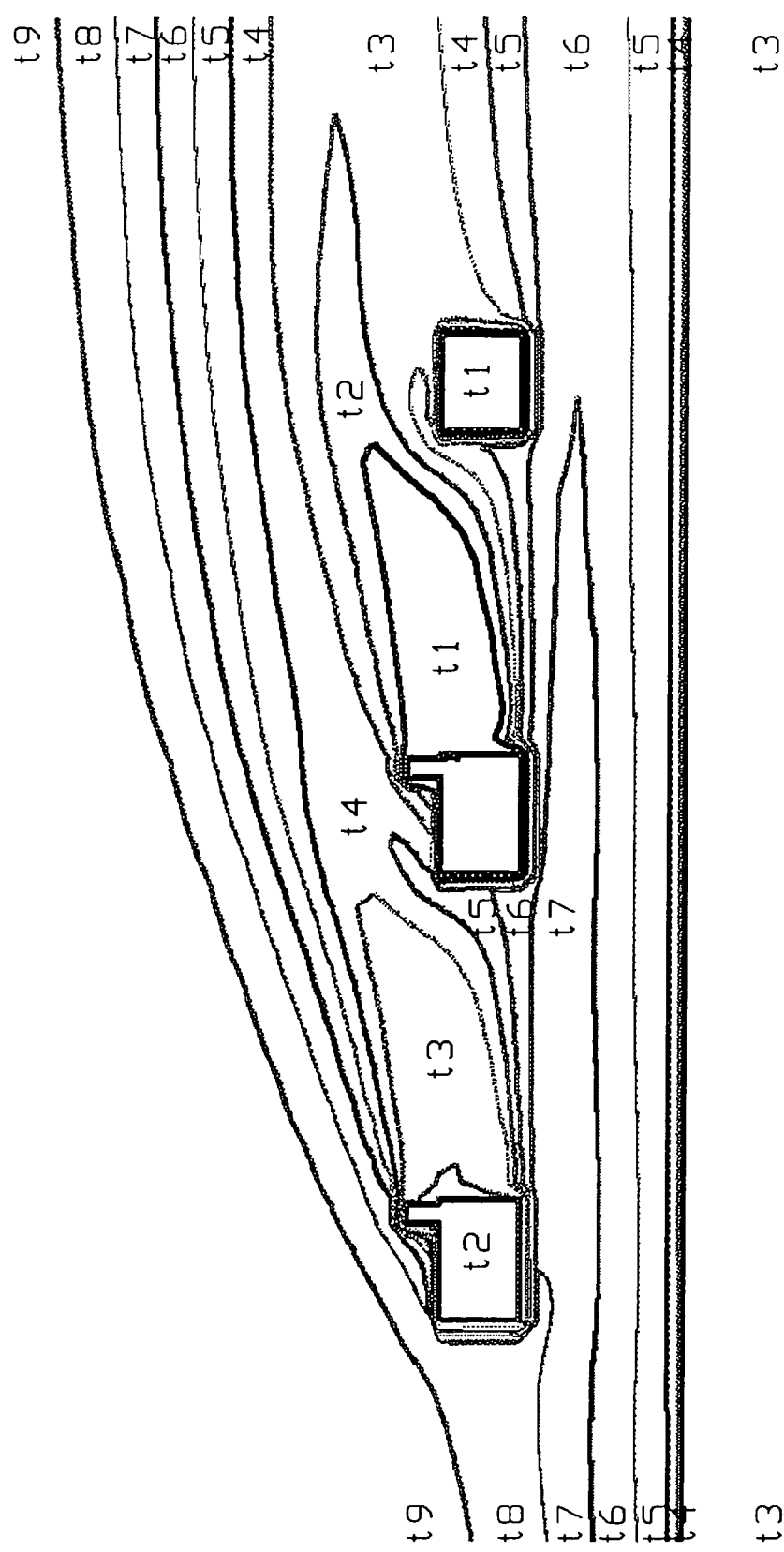
FIG. 4, a diagram of the temperature distribution on the heat exchanging device.

FIG. 4 shows the temperature distribution on the substrate in the area of channels 4 and webs 12 by means of isotherms t1 t9, with no web being present in the third channel in the flow direction 10 (at the right in FIG. 4) in order to illustrate the effect of the webs. The temperature differential between adjacent isotherms t1 t9 is roughly 4 K, the highest temperature t1 being roughly 342 K and the lowest temperature t9 roughly 308 K. In the areas in which the isotherms are very close together, that is, where the greatest temperature gradient appears, the greatest heat transfer is present. From FIG. 4 it is clearly evident that this appears precisely in the area of the webs, as well as at the edge of the substrate on the upstream side of channels 4. At these two areas, as well as on the bottom of the substrate, a turbulence of the flow appears, which brings about the greatest heat transfer. It is also recognizable that the heat transfer is best in the area of the first two channels in the direction of flow and then decreases in flow direction 10, since the fluid is warmed up while passing over the substrate and thus provides a poorer cooling power.

FIG. 5 shows the flow profile of the fluid along the substrate. It is recognizable that a downwards directed flow component is also present behind the webs in the flow direction. It is also recognizable that an acceleration of the flow appears because of the expansion of heated air.

Figure 6:
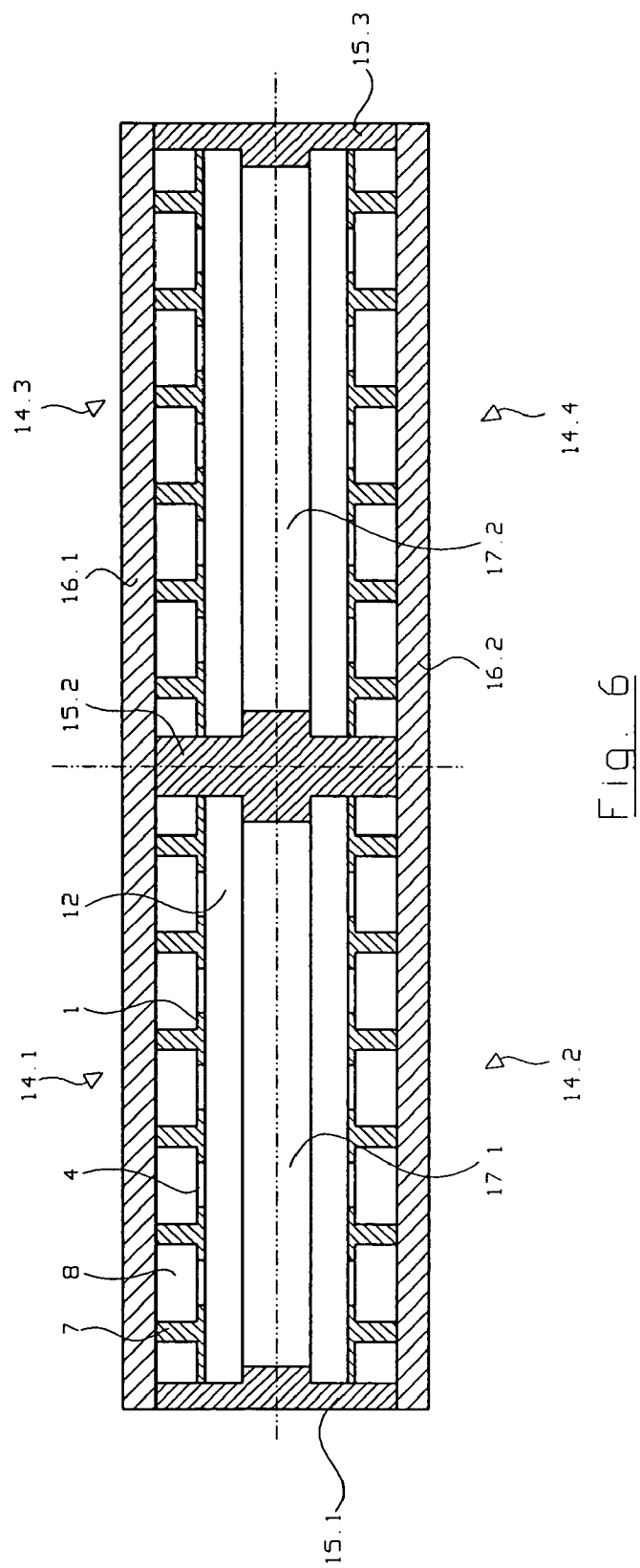
FIG. 6, an arrangement, which can be modularly expanded, of several heat exchanging devices according to the invention.

An individual heat exchanging device according to the previously described embodiments of FIGS. 1 5 will be referred to below as module 14. FIG. 6 shows an embodiment with four such modules 14.1 14.4 which face one another in pairs such that the webs 12 point towards one another, two pairs 14.1, 14.2 and 14.3, 14.4 being arranged side by side. The individual modules are positioned by spacers 15.1, 15.2 and 15.3 and are held together in a compact structural unit by cover plates 16.1 and 16.2 which form a rectangular housing together with lateral spacers 15.1 and 15.3. This structural unit forms a wide shaft 17.1, 17.2, through which the heat exchanger fluid flows, as well as through channels 4 and 8. The spacers 15.1, 15.2 and 15.3 are preferably made of thermally conductive material in order to couple the individual modules together thermally. The fluid such as air flows in horizontally, parallel to the cover plates 16.1 and 16.2, one of which is in thermal contact with the object to be cooled, not shown. Such a constructive unit can also be further expanded modularly as desired by stacking several such constructive units one on top of the other and/or laying them side by side.

Figure 7:
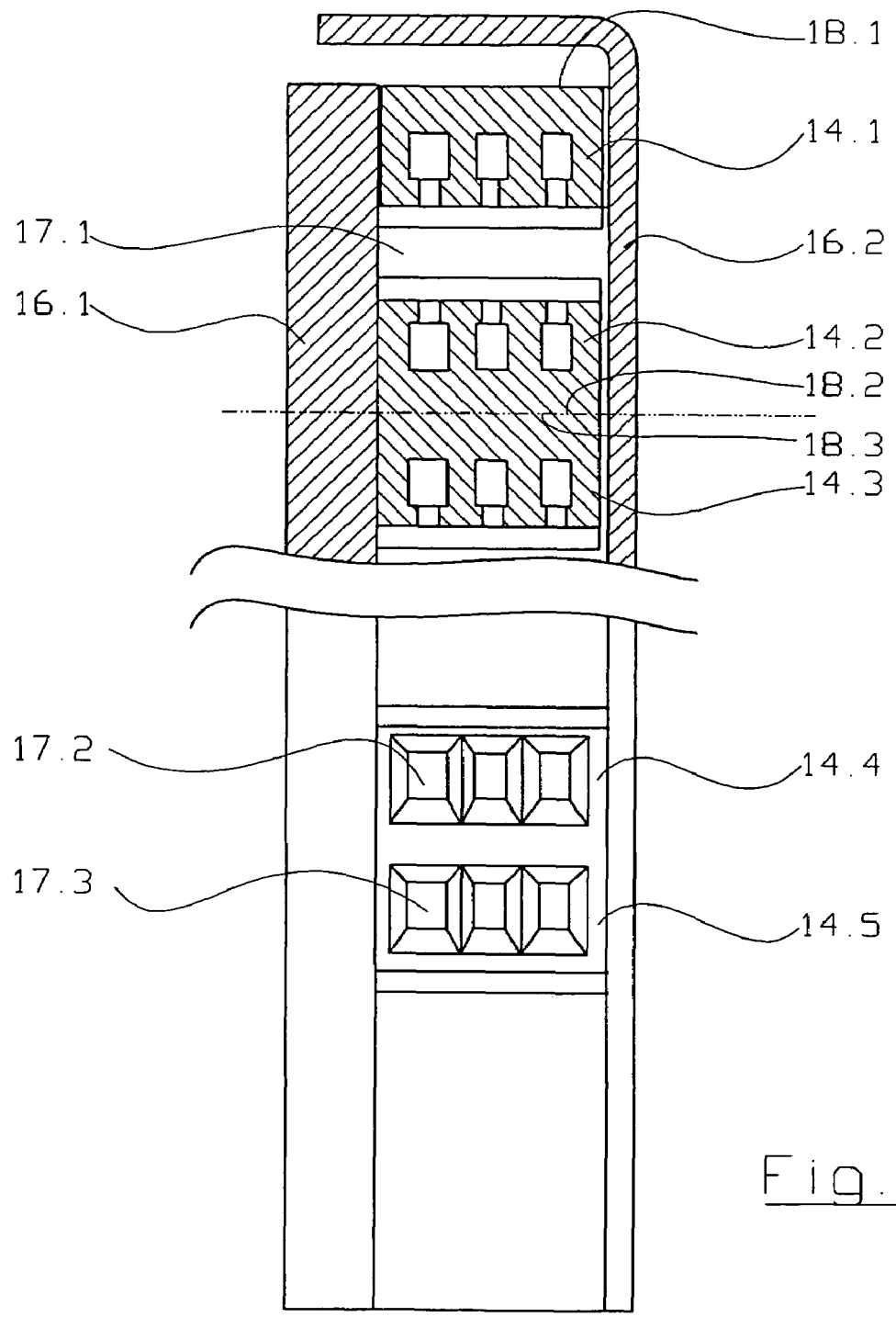
FIG. 7, another arrangement of heat exchanging devices in vertical orientation.

FIG. 7 shows an embodiment that is modified as compared to FIG. 6, in which several modules are stacked vertically. The upper three modules 14.1 14.3 are shown here in section, while the two lower modules 14.4 and 14.5 that are shown represent a front view. Heat is taken in from the side via a cover plate 16.1. It is also recognizable that individual modules such as 14.2 and 14.3 are in direct contact at rear sides 18.2 and 18.3 of their substrates. In this arrangement, then, several shafts 17.1 . . . 17.3 are formed, one above the other and are struck by the flow horizontally, i.e., perpendicular to the drawing plane of FIG. 7.

Figure 8:
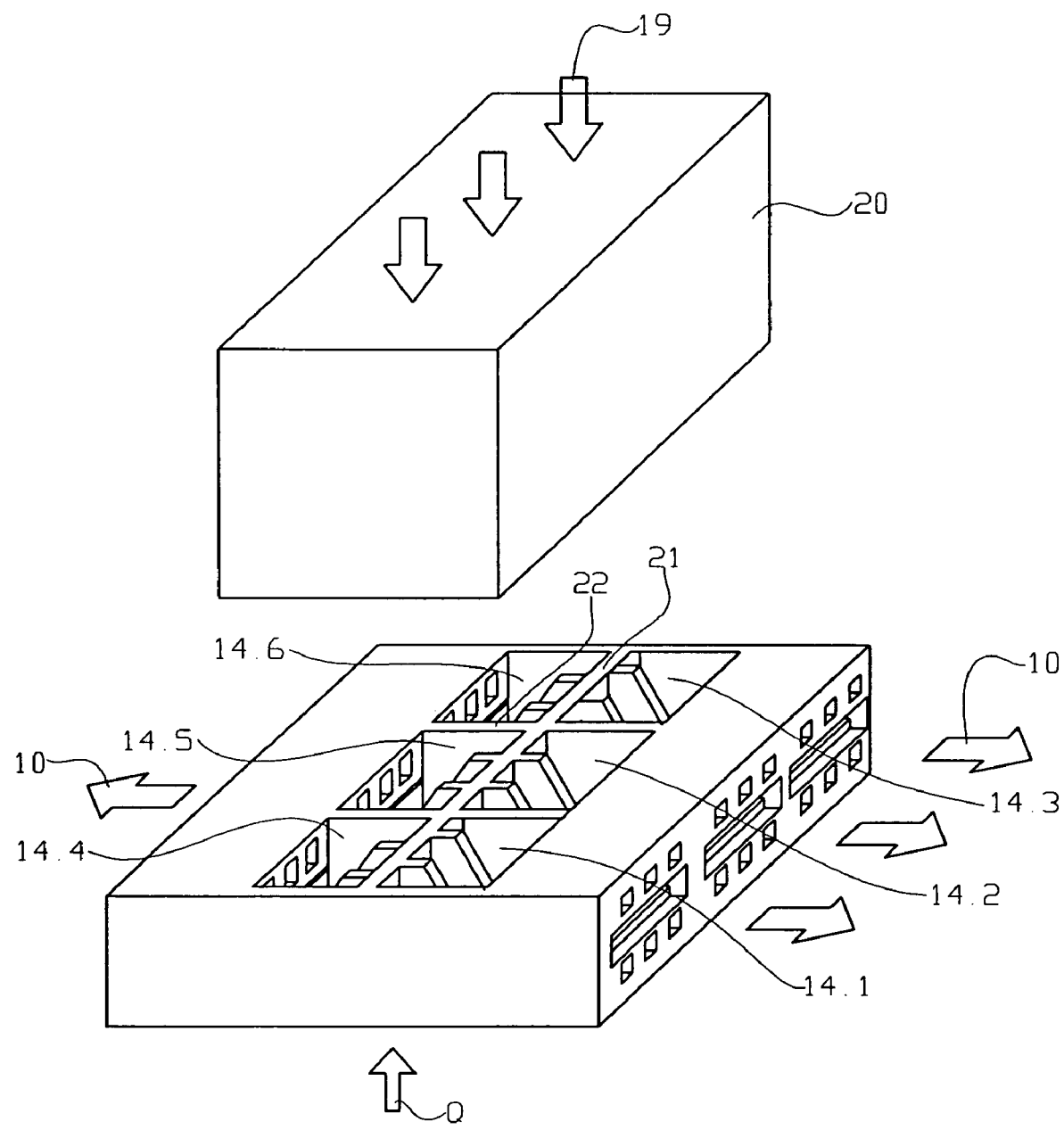
FIG. 8, an arrangement of heat exchanging devices according to the invention with vertical flow of fluid towards the substrate.

FIG. 8 shows a variant of an arrangement of several modules 14.1 14.6 in a housing, with the incoming air (cf. arrows 19) being supplied perpendicular to the flow direction 10 of the individual modules; this results due to flow guide plates 20 and appropriate deflection in the individual modules. Outflow takes place here to both sides (cf. arrows 10), since the individual modules are separated from one another by a longitudinal separating wall 21, where the incoming air 19 is divided. The individual modules can also separated from one another by perpendicular separating walls 22, in order to guarantee defined flow conditions inside a module. Heat is supplied here at the side opposite the guide plates 20 and is indicated by arrow Q. This embodiment is also expandable arbitrarily in all dimensions (width, length and height). The fluid can also be brought in from a remote fan via hoses or pipes.

Figure 9:
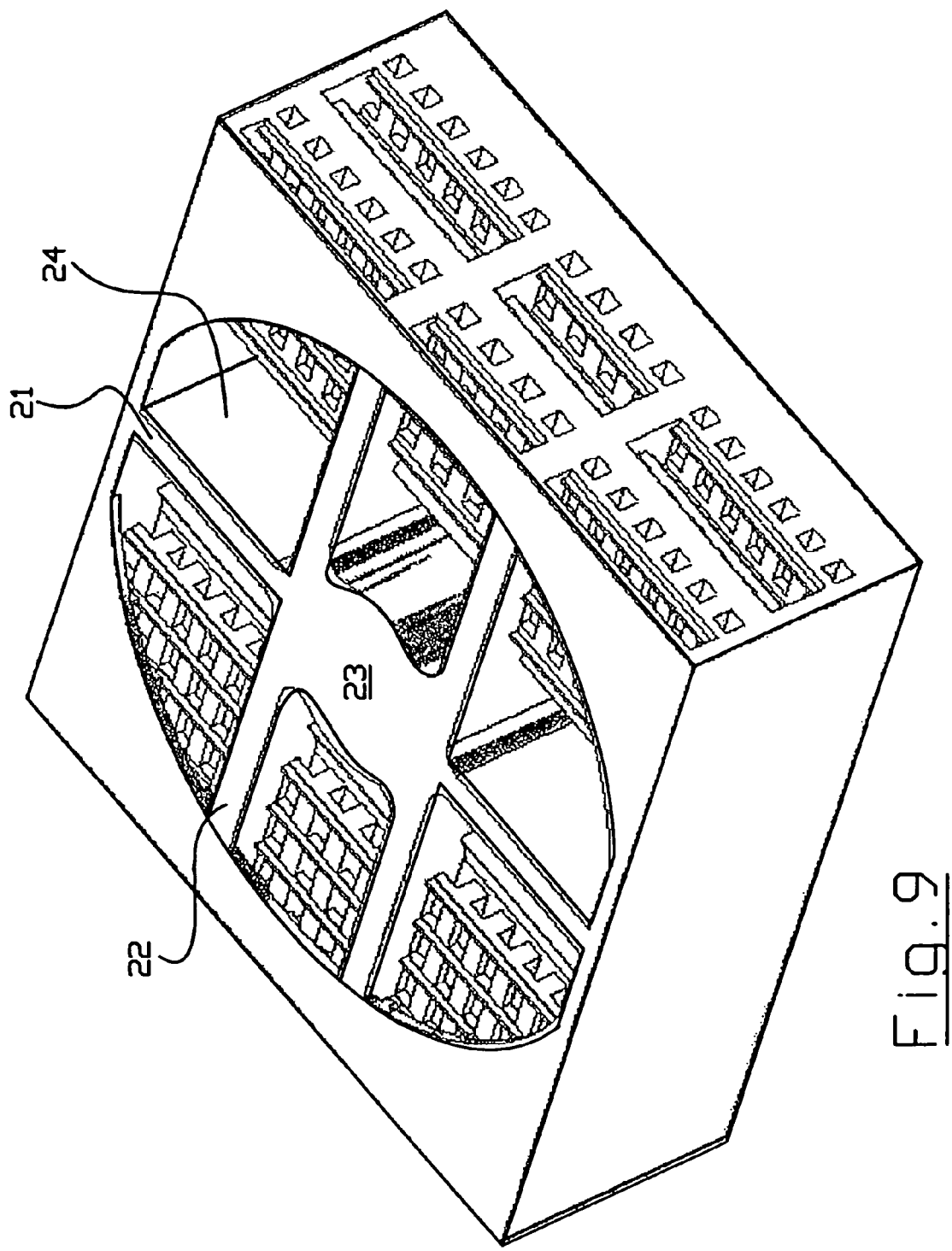
FIG. 9, a perspective view similar to the model of FIG. 8, but with a material core in the central area, on which a fan can be mounted.

FIGS. 9 and 10 show an embodiment modified somewhat from FIG. 8, in which a material core 23, on which a fan can be mounted, is provided in the central area. Supply openings 24 to the individual modules are then adapted to the contour of the fan and overall form approximately a circular shape.

As is recognizable from FIG. 10a, several modules are arranged here side by side and one on top of the other at the same time. Here too, it is recognizable that this structural form is arbitrarily expandable.

From the sectional view of FIG. 10c, it is also recognizable that several modules can be integrated into a constructive unit and that, for an inflow (arrow 19) perpendicular to the outflow (arrow 10), guide plates 25.1, 25.2 can still be provided; they deflect the flow on the one hand, and distribute it to the individual flow paths on the other.

In general, it can be added that an essential advantage of the heat exchanging device according to the invention is that, compared to prior art, it produces equal cooling power for a markedly reduced fluid flow rate or better cooling power at the same flow rate. Thereby one obtains a lower power consumption by the fan, a noise reduction, a weight reduction and smaller, cheaper fans, a smaller overall space requirement and thus also lower logistics costs.

In conclusion, it should also be pointed out that the substrate with the channels and the webs can be employed as a general purpose heat exchanger, i.e., for heating an object by subjecting it to a flow of a hot medium or for targeted heating of a medium (fluid) such as a process gas.

It should also be mentioned that the fluid flow can also be generated by moving the substrate and the object to be cooled or heated, on which the substrate is placed, with respect to a medium. For instance, the substrate can be mounted on a vehicle such as a car or a ship which generates the fluid flow as it moves.

The following general rules can be propounded for the dimensioning of channels 4 and 8 and webs 12 as well as spacers 7:

The length of turbulence zone TL (FIG. 3) following webs 12 in flow direction 10 depends primarily on the height RH of webs 12. The length DL of the channels in the direction of flow should therefore be at least twice as large as the height RH of the webs. Furthermore, the height KH of spacers 7, i.e., the spacing between substrate 1 and the object 11 to be cooled, should be greater than or equal to the length SL of the webs. The height of the webs should also be less than the spacing of adjacent webs in flow direction (10).

In view of the above, it will be seen that the several objects of the invention are achieved and other advantageous results attained.

As various changes could be made in the above methods and products without departing from the scope of the invention, it is intended that all matter contained in the above description and shown in the accompanying drawings shall be interpreted as illustrative and not in a limiting sense.

What is claimed is:

1. A heat exchanger comprising:
   a substrate that comprises a bottom side and a top side;
   a unit for generating a directed fluid stream with a flow direction that is tangential to the bottom side and to the top side of the substrate;
   webs projecting from the top side of the substrate and perpendicular to the flow direction, lying one after the other in the flow direction, wherein a height of the webs is less than a spacing of adjacent webs in the flow direction; and
   a plurality of regularly arranged channels extending through the substrate;
   wherein the substrate is placed via spacers on an object and a height of the spacers is greater than the height of the webs; and
   wherein the height of the spacers is less than a length of the channels in the flow direction.

2. The heat exchanger of claim 1 wherein the webs extend continuously over a width of the substrate.

3. The heat exchanger of claim 2 wherein the webs are arranged directly in front of the channels in the flow direction.

4. The heat exchanger of claim 1 wherein the webs are arranged directly in front of the channels in the flow direction.

5. The heat exchanger of claim 3 wherein the channels have a rectangular shape with adjacent sides of unequal length with a longer side oriented parallel to the flow direction.

6. The heat exchanger of claim 1 wherein the channels have a rectangular shape with adjacent sides of unequal length with a longer side oriented parallel to the flow direction.

7. The heat exchanger of claim 1 wherein the spacer project between the channels from the bottom side of the substrate and extend over the length of substrate to form longitudinal channels.

8. The heat exchanger of claim 1 wherein the spacers consist of thermally conductive material.

9. The heat exchanger of claim 1 wherein the substrate consists of metal.

10. The heat exchanger of claim 1 wherein the substrate consists of a material which is coated with thermally conductive material.

11. The heat exchanger of claim 1 further comprising a guide plate arranged at an inflow side of the substrate.

12. The heat exchanger of claim 1 wherein several heat exchangers are modularly arranged in an arrangement selected from the group of arrangements consisting of side-by-side, one above the other, and one behind the other.

13. The heat exchanger of claim 1 wherein guide plates are arranged such that a fluid stream arriving perpendicular to the direction of flow is deflected.

14. A heat exchanger comprising:
a substrate that comprises a bottom side and a top side;
a unit for generating a directed fluid stream with a flow direction that is tangential to the bottom side and to the top side of the substrate;
webs projecting from the top side of the substrate and perpendicular to the flow direction, lying one after the other in the flow direction, wherein a height of the webs is less than a spacing of adjacent webs in the flow direction; and
a plurality of regularly arranged channels extending through the substrate;
wherein a cover plate is arranged a distance away from the top side of substrate, wherein a spacing of the cover plate from the top side of the substrate is at least twice the height of the webs, wherein a side of the cover plate facing the top side of the substrate comprises cover plate webs that correspond to the webs on the top side of the substrate, wherein the cover plate webs are obstacles to flow.

* * * * *